United States Patent
Sivaraman et al.

(10) Patent No.: US 7,096,438 B2
(45) Date of Patent: Aug. 22, 2006

(54) METHOD OF USING CLOCK CYCLE-TIME IN DETERMINING LOOP SCHEDULES DURING CIRCUIT DESIGN

(75) Inventors: Mukund Sivaraman, Mountain View, CA (US); Shail Aditya Gupta, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 491 days.

(21) Appl. No.: 10/266,826

(22) Filed: Oct. 7, 2002

(65) Prior Publication Data

US 2004/0068708 A1  Apr. 8, 2004

(51) Int. Cl.
 G06F 17/50  (2006.01)
(52) U.S. Cl. .................... 716/5; 716/4; 716/6
(58) Field of Classification Search ............ 716/2, 716/5–6, 8–11; 711/118; 713/300; 717/160, 717/161; 326/93
See application file for complete search history.

(56) References Cited

U.S. PATENT DOCUMENTS

| | | | |
|---|---|---|---|
| 5,764,951 A | 6/1998 | Ly et al. | |
| 5,801,958 A | 9/1998 | Dangleo et al. | |
| 5,870,308 A | 2/1999 | Dangleo et al. | |
| 5,930,510 A * | 7/1999 | Beylin et al. | 717/161 |
| 5,963,730 A | 10/1999 | Toyonaga et al. | |
| 6,096,092 A | 8/2000 | Takahashi et al. | |
| 6,105,139 A * | 8/2000 | Dey et al. | 713/300 |
| 6,216,252 B1 | 4/2001 | Dangleo et al. | |
| 6,324,678 B1 | 11/2001 | Dangleo et al. | |
| 6,374,403 B1 | 4/2002 | Darte et al. | |
| 6,438,747 B1 | 8/2002 | Schreiber et al. | |
| 6,457,159 B1 | 9/2002 | Yalcin et al. | |
| 6,460,173 B1 | 10/2002 | Schreiber | |
| 6,463,576 B1 | 10/2002 | Tomoda | |
| 6,493,863 B1 | 12/2002 | Hamada et al. | |
| 6,507,947 B1 * | 1/2003 | Schreiber et al. | 717/160 |
| 6,625,797 B1 | 9/2003 | Edwards et al. | |
| 6,634,024 B1 * | 10/2003 | Tirumalai et al. | 717/161 |
| 6,662,271 B1 * | 12/2003 | Smits | 711/118 |
| 6,678,871 B1 * | 1/2004 | Takeyama et al. | 716/6 |
| 6,684,376 B1 | 1/2004 | Kerzman et al. | |
| 6,941,541 B1 * | 9/2005 | Snider | 716/18 |
| 2004/0046590 A1 * | 3/2004 | Singh et al. | 326/93 |
| 2004/0068331 A1 | 4/2004 | Cronquist et al. | |
| 2004/0068711 A1 | 4/2004 | Gupta et al. | |
| 2004/0068718 A1 | 4/2004 | Cronquist et al. | |

OTHER PUBLICATIONS

Cheng-Tsung Hwang et al—"A Formal Approach to the Schedulung Problem in High Level Synthesis"—Apr. 1, 1991—pp. 464-475.

Pugh, W—"A Practical Algorithm for Exact Array Dependence Analysis"—Aug. 1, 1992—pp. 102-114.

Govindarajan R et al—"A Novel Framework for Multi-Rate Scheduling in DSP Applications"—Oct. 25, 1993—pp. 77-88.

Goossens G et al—"Loop Optimization in Register-Transfer Scheduling for DSP-Systems"—Jun. 25, 1989—pp. 826-831.

(Continued)

*Primary Examiner*—Vuthe Siek

(57) ABSTRACT

A method for determining validity of a proposed loop iteration schedule comprising the steps of receiving a dependence graph including operations and edges between said operations; receiving a performance specification; receiving an assignment of latencies to operations of said dependence graph; and determining existence of a placement of clock cycle-boundaries in said dependence graph such that all dependence and timing constraints are satisfied for the performance specification.

39 Claims, 4 Drawing Sheets

OTHER PUBLICATIONS

Leiserson, C.E. and J. B. Saxe, "Retiming Synchronous Circuitry", Systems Research Center of Digital Equipment Corporation in Palo Alto, California. (Aug. 20, 1986).

Kirkpatrick, T.I. and N. R. Clark, "PERT as an Aid to Logic Design", IBM Journal of Research and Development, vol. 10 (1996) pp. 135-141.

Devadas, S., et al. "Computation of Floating Mode Delay in Combinational Logic Circuits: Theory and Algorithms" IEEE Transactions on Computer-Aided Design of Integrated Circuits and Systems, vol. 12 (Dec. 1993) pp. 1913-1923.

U.S. Appl. No. 09/378,298, Schreiber et al.

U.S. Appl. No. 10/266,830, Sivaraman et al.

U.S. Appl. No. 10/266,831, Sivaraman et al.

Charlesworth, A.E. "An Approach to Scientific Array Processing: The Architecural Design of the AP-120B/FPS-164 Family", Computer, vol. 14, No. 9 (Sep. 1981) pp. 18-27.

Rau, B. R. "Iterative Modulo Scheduling", International Journal of Parallel Programming, vol. 24, No. 1 (1996) pp. 3-64.

"Managing Design Complexity with Behavioral Synthesis", [online] [Retrieved On: Sep. 10, 2002] Retrieved from: http://www.synopsis.com/products/beh_syn/beh_syn_br.html (pp. 1-14).

Behavioral Compiler User Guide, Chapter 3, "Optimizing Timing and Area," pp. 3-1 through 3-78, v. 2000.11.

Malik, S. "Analysis of Cyclic Combinational Circuits" IEEE Transactions on Computer-Aided Design of Integrated Circuits and Systems, vol. 13, No. 7 (Jul. 1994) pp. 950-956.

Srinivasan, A. and Sharad Malik. "Practical Analysis of Cyclic Combinational Circuits" IEEE Custom Integrated Circuits Conference (1996) pp. 381-384.

John C. Gyllenhaal et al., HMDES Version 2.0 Specification, Technical Report IMPACT-96-3, 1996, University of Illinois at Urbana-Champaign, Urbana, IL.

D.J. Kuck et al., Dependence Graphs and Compiler Optimizations, Proceedings of the 8th ACM SIGPLAN-SIGACT symposium on Principles of programming languages, 1981, pp. 207-218, ACM Press, New York, NY.

Andreas Kuehlman et al., Timing Analysis in High-Level Synthesis, Proceedings of the 1992 IEEE/ACM international conference on Computer-aided design, 1992, 349-354, IEEE Computer Society Press, Los Alamitos, CA.

Tai A. Ly et al., Applying Simulated Evolution to Scheduling in High Level Synthesis, Proceedings of the 33rd Midwest Symposium on Circuits and Systems, 1990, vol. 1, pp. 172-175, IEEE Press, Piscataway NJ.

John A. Nestor et al., SALSA: A New Approach to Scheduling with Timing Constraints, Proceedings of the International Conference on Computer Aided Design, 1990. pp. 262-265 IEEE Computer Society, Los Alamitos, CA.

B. Ramakrishna Rau, Iterative Modulo Scheduling, HP Labs Technical Report HPL-94-115, 1995, Hewlett-Packard, Palo Alto, CA.

Michael Schlansker et al., Acceleration of First and Higher Order Recurrences on Processors with Instruction Level Parallelism, Lecture in Computer Science: vol. 768, Proceedings of the 6th International Workshop on Languages and Compilers for Parallel Computing, 1993, pp. 406-429, Springer-Verlag, London UK.

Robert Schreiber et al., High-Level Synthesis of Nonprogrammable Hardware Accelerators, Tech Report: HPL-2000-31, 2000, Hewlett-Packard, Palo Alto, CA.

Robert Schreiber et al., PICO-NPA: High-Level Synthesis of Nonprogrammable Hardware Accelerators, HPLabs : Tech Report: HPL-2001-249, Oct. 16, 2001, Hewlett Packard, Palo Alto, CA.

* cited by examiner

```
FOR (i = 0; i < 100; i++)
    FOR (j = 0; j < 100; j++)
        SUM = 3*SUM + a[i] [j];
```
*FIG. 1A*
*(PRIOR ART)*
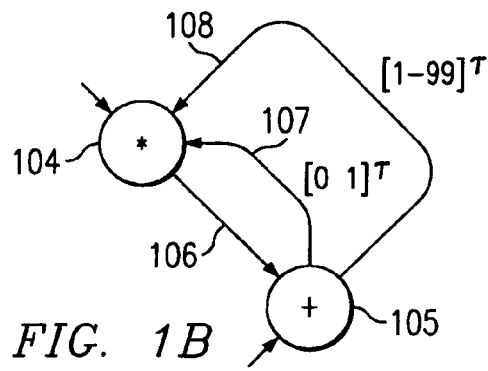
*FIG. 1B*
*(PRIOR ART)*
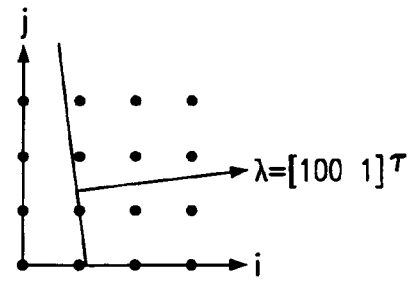
*FIG. 1C*
*(PRIOR ART)*
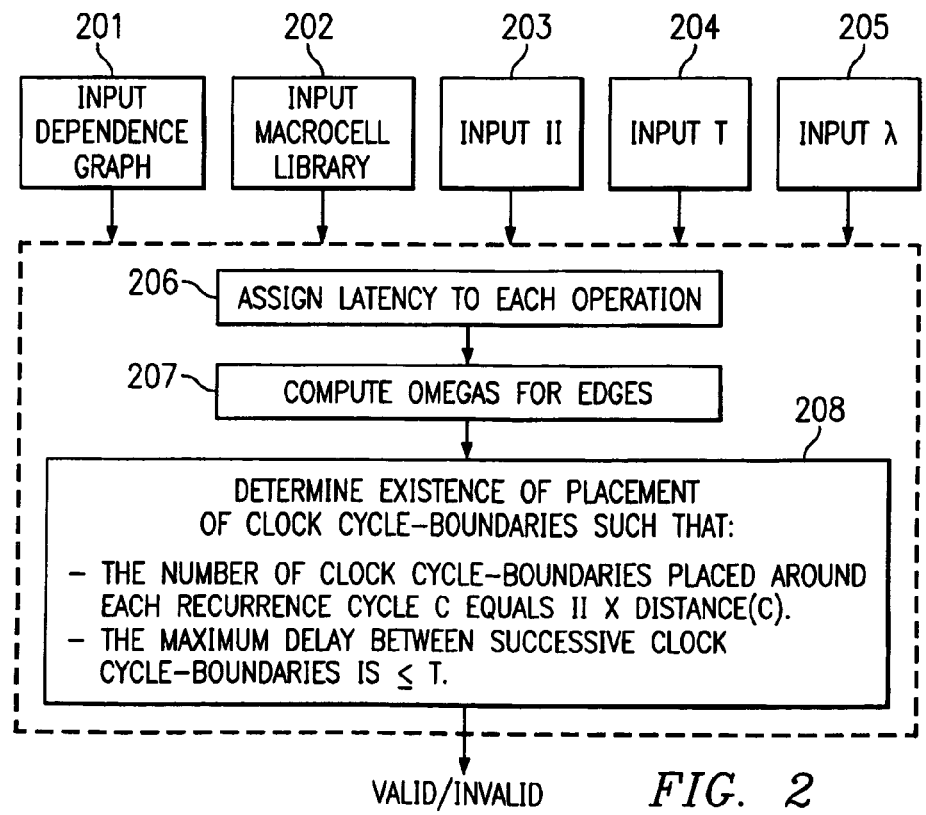
*FIG. 2*

METHOD OF USING CLOCK CYCLE-TIME IN DETERMINING LOOP SCHEDULES DURING CIRCUIT DESIGN

CROSS-REFERENCE TO RELATED APPLICATIONS

The present application is related to commonly-assigned U.S. patent application Ser. No. 10/266,830 entitled "SYSTEM FOR AND METHOD OF CLOCK CYCLE-TIME ANALYSIS USING MODE-SLICING MECHANISM," and U.S. patent application Ser. No. 10/266,831 entitled "METHOD FOR DESIGNING MINIMAL COST, TIMING CORRECT HARDWARE DURING CIRCUIT SYNTHESIS," filed concurrently herewith, the disclosures of which are hereby incorporated by reference in their entireties.

FIELD OF THE INVENTION

The present invention is directed generally to digital circuit design and, more specifically, to a method for using clock cycle-time analysis in determining loop iteration schedules in order to synthesize higher-performance, lower-cost circuits.

BACKGROUND

Continuing advances in technology combined with dropping production costs have led to a proliferation of electronic devices that incorporate or use advanced digital circuits including desktop computers, laptop computers, hand-held devices such as Personal Digital Assistants (PDAs), hand-held computers, cellular telephones, printers, digital cameras, facsimile machines and other electronic devices. These digital circuits execute the application or algorithms required to provide the functionality of the electronic device. It is desirable for these digital circuits to have high performance with minimal cost. The cost of a circuit is typically measured in terms of its silicon area and is often estimated from the number of components (e.g. functional units, registers, wires etc) in the circuit. The performance of a circuit can be expressed as a combination of several metrics: throughput (i.e. number of tasks executed per clock cycle), latency (i.e. number of clock cycles to complete a single task), and clock speed.

The process of mapping an application or algorithm to digital circuit hardware involves several steps. One of these steps is that of scheduling, i.e., assigning activities to occur at specific points in time. Since the performance of many applications is dominated by the performance of loop nests that may be present in the application code or algorithm, the step of loop iteration scheduling is of particular importance. A loop is an iteration of an expression or expressions for a range of values. A loop nest is a set of loops, each one successively nested within another. Alternatively, a nested loop refers to a program in a high level language such as C, Java, Pascal, etc. that has an "n-deep" loop nest, where n is an integer. In other words, for a 2-deep nested loop, a first loop is nested within a second loop.

Loop iteration scheduling is the assignment of start times for each iteration of the loop nest to specific clock cycles. This step is performed with the objective that the resulting hardware must execute the loop nest at the desired performance or that the resulting hardware must execute the loop nest with maximal performance. Additionally, it might be desirable to minimize the cost of the resulting hardware. The performance of a loop nest is determined by its throughput. i.e., the number of loop iterations started per unit time. Throughput is expressed as the reciprocal of II*T, where the Initiation Interval (II) is defined as the number of clock cycles between successive starts of loop iterations, and T is the clock period.

To meet these objectives in loop iteration scheduling, typically, a set of candidate iteration schedules are generated and then evaluated for validity. Additionally, they may also be evaluated for cost, if needed. Validity of a candidate loop iteration schedule implies that it is possible to satisfy all data dependencies and timing constraints when the loop nest is scheduled according to the candidate loop iteration schedule and with a given II and at a given T. Recurrence cycles are caused when there is a data flow dependence from a program operation to itself in a succeeding loop iteration. For data dependencies to be satisfied around recurrence cycles in loops, the following set of inequalities must be satisfied:

$$\text{Delay}(C1) <= II \times \text{Distance}(C1)$$

$$\text{Delay}(C2) <= II \times \text{Distance}(C2)$$

...

$$\text{Delay}(CN) <= II \times \text{Distance}(CN)$$

where there are "N" recurrence cycles in the dependence graph C1, C2, ..., CN; Delay(Ci) is the total latency around the recurrence cycle Ci; and Distance(Ci) is the sum of the omegas of each dependence edge along the recurrence cycle Ci. The latency around a recurrence cycle is the number of clock periods it takes for the dependencies to travel around the recurrence cycle, and the omega of a dependence edge is the loop iteration separation, as given by the candidate iteration schedule, between the producer and the consumer operations in that data flow.

In this context, it is desirable that the total latency around each recurrence cycle be small, so that a candidate loop iteration schedule is validated for the given II and T. Prior approaches use operation latencies expressed as integer multiples of clock cycles. The recurrence cycle latencies computed by these approaches are conservative, thereby leading to pessimistically rejecting some candidate iteration schedules as invalid. This is illustrated by the example in FIGS. 1A–1C.

FIG. 1A is a code fragment representing a nested loop. Code fragment 100 includes an outer loop 101, and inner loop 102 and a statement 103. FIG. 1B is a loop dependence graph corresponding to the nested loop code fragment of FIG. 1A. In FIG. 1B inter-iteration dependence edges are annotated with iteration distance vectors derived from the source code for the loop expressed in sequential semantics. The dependence graph of FIG. 1B has two recurrence cycles: recurrence cycle C1 consisting of operation 104->edge 106->operation 105->edge 107; and recurrence cycle C2 consisting of operation 104->edge 106->operation 105->edge 108.

As an example, the required performance may dictate an II equal to 3, and T equal to 2.0 nanoseconds. For a candidate iteration scheduling vector $\lambda$ equal to $[100\ 1]^T$, the corresponding iteration scheduling wavefront is shown in the iteration space of FIG. 1C. The omega of an edge annotated with iteration distance vector d is the dot product $\lambda^T \cdot d$. Using this relationship, the omega of edge 107 in the iteration schedule given by $\lambda$ is $[100\ 1] \cdot [0\ 1]^T = 1$. Similarly, the omega of edge 108 in the iteration schedule given by $\lambda$ is $[100\ 1] \cdot [1-99]^T = 1$. The omegas of all other edges are 0 because their iteration distance vectors d equal $-[0\ 0]^T$. The distance associated with recurrence cycle C1, i.e., Distance (C1), is given by the sum of the omegas along its edges (i.e., edges 106 and 107 in FIG. 1B), therefore it is 0+1=1. Similarly, the distance associated with recurrence cycle C2, i.e., Distance (C2) is 0+1=1. Prior approaches use operation latencies expressed as integer multiples of clock cycles. For example, the latency for the multiplication operation (*) may be 3 clock cycles and the latency for the addition operation (+) may be 1 clock cycle. For the recurrence cycle C1, the delay is 3+1=4 clock cycles. The inequality Delay (C1)≦II×Distance(C1) is used giving: 4−3×1<=0, which is not satisfied. Similarly, for the recurrence cycle C2, the delay is 3+1=4 clock cycles. The inequality Delay(c1)≦II× Distance(c1) is used giving: 4−3×1<=0, which is also not satisfied. Therefore, when operation latencies are expressed as integer multiples of clock cycles, the candidate iteration scheduling vector $\lambda$ equal to $[100\ 1]^T$ is found not to be valid.

SUMMARY

The present invention includes a method for determining validity of a proposed loop iteration schedule comprising the steps of receiving a dependence graph including operations and edges between said operations; receiving a performance specification; receiving an assignment of latencies to operations of the dependence graph; and determining existence of a placement of clock cycle-boundaries in the dependence graph such that all dependence and timing constraints are satisfied for the performance specification.

BRIEF DESCRIPTION OF THE DRAWINGS

FIG. 1A shows an n-deep nested loop code fragment where n=2;

FIG. 1B shows a dependence graph which corresponds to the nested loop code fragment of FIG. 1A;

FIG. 1C shows an iteration space and scheduling vector corresponding to the nested loop code fragment of FIG. 1A and the dependence graph of FIG. 1B;

FIG. 2 depicts a flow diagram of a method to determine the validity of the loop iteration schedule resulting from the loop iteration schedule vector ($\lambda$), initiation interval II and clock cycle time (T);

DETAILED DESCRIPTION

Figure 3:
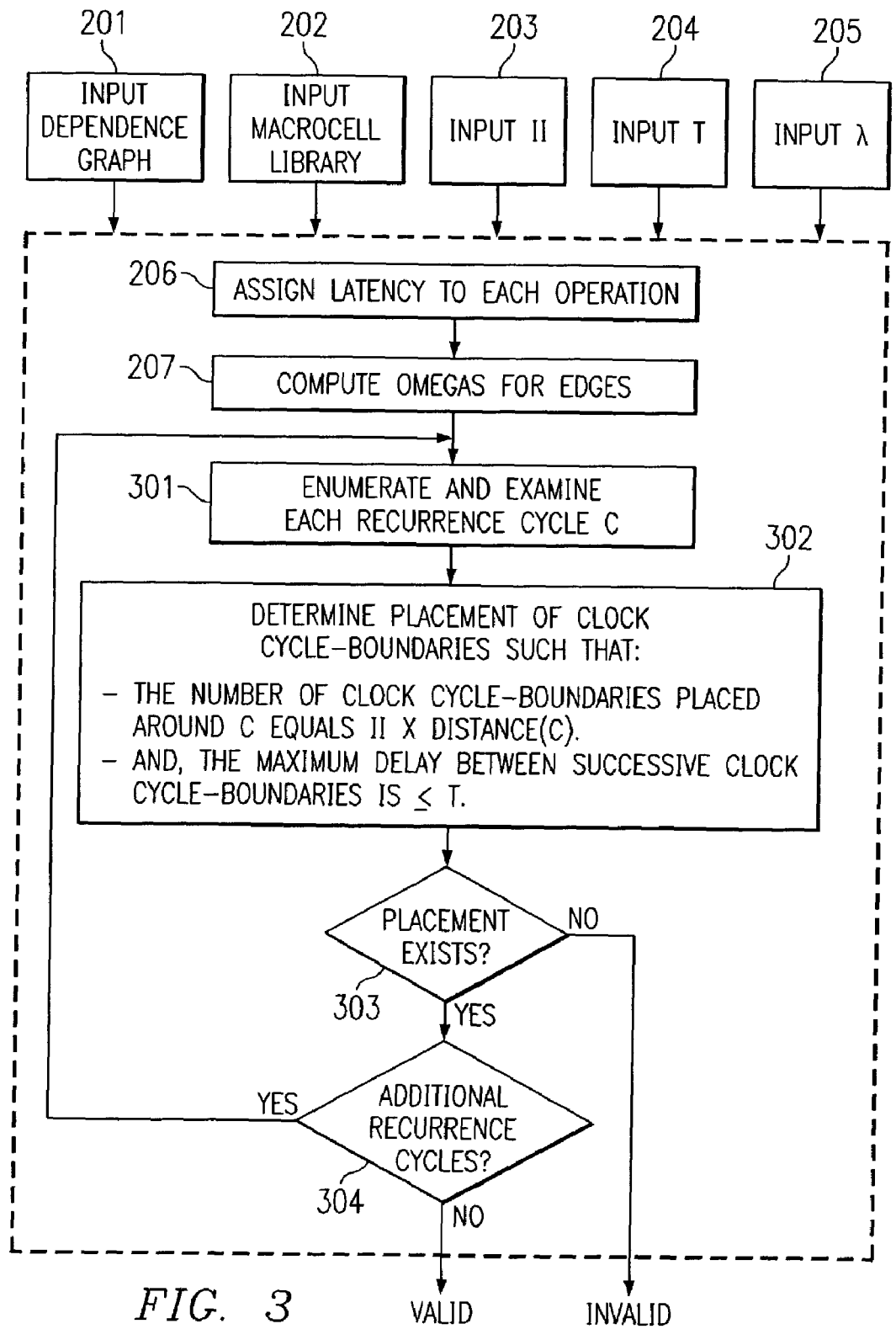
FIG. 3 is a flow diagram of a method to determine the validity of the loop iteration schedule resulting from $\lambda$, II and T using recurrence cycle enumeration.

Prior approaches use operation latencies expressed as integer multiples of clock cycles, resulting in conservative recurrence cycle latencies, thereby leading to pessimistically rejecting some candidate iteration schedules as invalid. The present invention uses operation latencies expressed as real-time delays (for example, in nanoseconds) to enable scheduling of multiple flow-dependent operations within the same clock period, thereby deriving smaller recurrence cycle latencies. This enables more candidate iteration schedules to be validated, leading to iteration scheduling of loop nests with higher performance.

FIG. 2 depicts a flow diagram to determine the validity of the loop iteration schedule resulting from a candidate loop iteration scheduling vector ($\lambda$), initiation interval II, and clock cycle-time (T). Validity of the loop iteration schedule implies that all data dependencies and timing constraints can be satisfied when the loop nest is scheduled according to $\lambda$ and with the candidate II and at the candidate T. The dependence graph corresponding to the original loop nest is received as input in step 201. Typically the dependence graph will include a number of operations such as additions, multiplications, subtractions, etc. as nodes, and edges interconnecting the nodes to signify dependencies among the operations. Step 202 is used to receive the macrocell library. Steps 203 and 204 are used to receive the performance specification, i.e., the iteration interval (II), and the clock cycle (T) respectively. Step 205 is used to receive the candidate loop iteration scheduling vector ($\lambda$). In one embodiment, the performance specification constitutes the initiation interval and the clock cycle. Each macrocell in the macrocell library conceptually represents the set of hardware implementations that can execute a predetermined set of operations. We associate with each macrocell, a set of latencies. These latencies may be expressed in many different ways, for instance as integer multiples of the clock cycle-time T, or as real-time delays in units of nanoseconds. In a preferred embodiment, they are expressed as latency tuples of the form <$\Delta$in, pd, $\Delta$out>. Each tuple is associated with an operation executing on a hardware implementation of the macrocell, and corresponds to the time taken by the hardware implementation to execute the operation. More specifically, $\Delta_{in}$ refers to the delay between when the input signal arrives and when this signal reaches the first latch in the hardware implementation. The pipeline depth (pd) is the number of latching stages in the hardware implementation. Finally, $\Delta_{out}$ refers to the delay between when the signal starts from the final latch in the hardware implementation and when it arrives at the output. $\Delta_{in}$ and $\Delta_{out}$ are expressed in units of nanoseconds. Pipeline depth is an integer >=0. If it is zero, then the latency tuple can be written compactly as <$\Delta_{thru}$>, which represents the delay of a signal to go from the input to the output of the hardware implementation. The macrocell library represents a set of hardware implementations that constitute some set of operations. For example, an adder macrocell may represent a number of representations of hardware implementations for adders. As described, the macrocell library includes tuples associated with the various hardware implementations.

In step 206 a latency is assigned to each operation included in the dependence graph. In a preferred embodiment, each operation in the loop dependence graph is associated with a latency tuple corresponding to a fastest hardware implementation amongst all the macrocells in the library that can execute this operation. This may be denoted as <$\Delta_{in,op}$, $pd_{op}$, $\Delta_{out,op}$> for operation op. In one embodiment, a hardware implementation with latency tuple <$\Delta_{in1}$, $pd_1$, $\Delta_{out1}$> is considered to be no slower than another with latency tuple <$\Delta_{in2}$, $pd_2$, $\Delta_{out2}$> if and only if $pd_1$<$pd_2$ or, $pd_1$=$pd_2$ and $\Delta_{in1}$<=$\Delta_{in2}$ and $\Delta_{out1}$<=$\Delta_{out2}$. Note that the set of tuples for a macrocell may only form a partial ordering, not a total ordering. For example, <0.2, 1, 0.6> and <0.4, 1, 0.5> are unordered.

In step 207, the omega for every dependence edge e is computed to be $\lambda^T \cdot d$, where d is the iteration distance vector of e in the given dependence graph. Step 208 determines the existence of a placement of clock cycle-boundaries on the operations and edges of the dependence graph such that the dependence and timing constraints are satisfied for the specified performance. The dependence constraints are satisfied if the number of clock cycle-boundaries placed around each recurrence cycle C equals II*Distance(C), where Distance (C) is the sum of the omegas of the edges in C. The timing constraints are satisfied if the maximum delay between successive clock cycle-boundaries is less than or equal to T. If such a placement exists, then step 208 returns a 'valid' output, otherwise it returns an 'invalid' output.

The embodiment of the invention depicted in FIG. 2 may also be used to determine a comparative cost of the iteration schedule proposed by the input candidate scheduling vector (step 205), input initiation interval (step 203) and input clock cycle-time (step 204). In the comparative cost embodiment, step 208 may produce a placement of clock cycle-boundaries on the edges of the dependence graph and this placement may be used to estimate the cost of the resulting hardware associated with the proposed iteration schedule. In one embodiment, the cost equals the sum of the number of clock cycle-boundary bits as given by the placement. The number of clock cycle-boundary bits corresponding to the placement of a clock cycle-boundary on a dependency edge equals the bit width of the dependency edge.

FIG. 3 is a flow diagram of a method to determine the validity of the loop iteration schedule resulting from $\lambda$, II and T using recurrence cycle enumeration. FIG. 3 shows one embodiment of the invention described in FIG. 2. Here, cycle enumeration is used to determine the validity of the loop iteration schedule resulting from $\lambda$, II, and T. Steps 201–207 of FIG. 3 are identical to steps 201–207 of FIG. 2. In step 301 the recurrence cycles of the dependence graph are enumerated and examined. In step 302, for each recurrence cycle C, a placement of clock cycle-boundaries along the operations and edges of the recurrence cycle is determined such that the following conditions are satisfied: (i) the number of clock cycle-boundaries placed around recurrence cycle C equals II×Distance(C), where Distance(C) is the sum of the omegas of the edges in C, and, (ii) the maximum delay between successive clock cycle-boundaries is less than or equal to T. In a different embodiment, an additional condition may also be required to be satisfied: if clock cycle-boundaries have previously been placed due to the analysis of other recurrence cycles, those clock cycle-boundaries must be honored in the analysis of recurrence cycle C.

In a preferred embodiment of step 302 of FIG. 3, starting from an operation in the recurrence cycle C, the operations and edges in C are examined in dependency order, and a clock cycle-boundary is placed on an operation for every pipelining stage (pd) in its latency tuple, or a clock cycle-boundary is placed on an edge every time the maximum delay from the most recently placed clock cycle-boundary in C, if any, to the operation that the edge feeds into exceeds T. Clock cycle-boundaries may also be placed on a non-pipelined multi-cycle operation, i.e., one whose latency is of the form $<\Delta_{thru,op}>$, where $\Delta_{thru,op}$ is greater than T. Note that a clock-cycle boundary may not be placed on the edge between two operations if the two operations can be chained. Operator chaining may occur if the sum of the output delay of an operation and the input delay of the operation it feeds into is less than or equal to the input clock cycle time T. If the total number (N) of clock cycle-boundaries placed around C is <=II×Distance(C), the additional II*Distance (C)–N clock cycle-boundaries may be placed on any of the edges along the recurrence cycle C. Now, if the total number of clock cycle-boundaries placed around C equals II*Distance (C), and the maximum delay between all successive clock cycle-boundaries placed along C is less than or equal to T, then a placement is said to have been found for the recurrence cycle C, otherwise placement for the recurrence cycle C has not been found.

Step 303 returns an 'invalid' output if a placement was not found in step 302, otherwise if a placement does not exist step 304 is encountered. Step 304 checks to see if there are additional unexamined recurrence cycles, and if so, step 301 is encountered again. If additional unexamined recurrence cycles are not present, a 'valid' output is returned.

Figure 4:
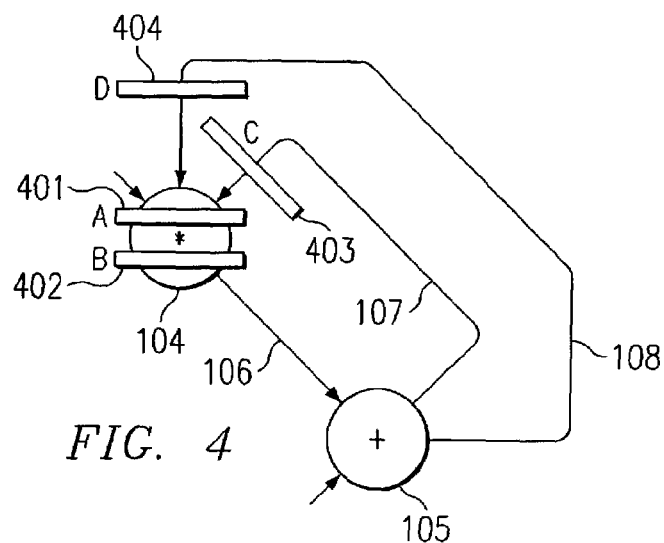
FIG. 4 is the dependence graph of FIG. 1B with clock cycle boundaries positioned using the flow diagram of FIG. 3.

FIG. 4 is the dependence graph of FIG. 1B with clock cycle boundaries positioned using the flow diagram of FIG. 3. FIG. 4 shows an example to illustrate the method of FIG. 3. For this example, in step 201 of FIG. 3, the input dependence graph received is the dependence graph shown in FIG. 1B. The macrocell library of step 202 (FIG. 3) contains tuples <1.6 ns, 2, 0.6 ns> and <0.3 ns, 3, 0.2 ns> for multiplication (*) operations and tuples <1.2 ns> and <0.1 ns, 1, 0.1 ns> for addition (+) operations. The II is 3 (step 203 of FIG. 3), $\lambda=[100\ 1]^T$ (step 205 of FIG. 3), and T=2.0 ns (step 204 of FIG. 3). In step 206, a latency associated with a fastest macrocell from the macrocell library is assigned to each operation so the <1.6 ns, 2, 0.6 ns> tuple is assigned to the * operation and the <1.2 ns> tuple is assigned to the + operation. The tuple for * was selected because pd=3 in <0.3 ns, 3, 0.2 ns> indicates a slower * operation than the pd=2 of the <1.6 ns, 2, 0.6 ns>. Similarly, pd=0 in tuple <1.2 ns> is less than pd=1 in tuple <0.1 ns, 1, 0.1 ns> for the + operation.

In step 207, the omegas are computed for each edge. The omega of an edge annotated with iteration distance vector d is the dot product $\lambda^T \cdot d$. Using this relationship, the omega of edge 107 is $[100\ 1] \cdot [0\ 1]^T = 1$. Similarly, the omega of edge 108 is $[100\ 1] \cdot [1-99]^T = 1$. The omegas of all other edges are 0 because their distance vectors d equal $[0\ 0]^T$. In step 301, recurrence cycles C1 and C2 are individually examined. Step 302 determines the placement of clock cycle-boundaries around recurrence cycle C1. The maximum number of clock cycle-boundaries that can be placed around recurrence cycle C1 equals II×Distance (C1), i.e., 3*(0+1)=3. The placement of clock cycle-boundaries around recurrence cycle C1 is determined as follows. Starting at the * operation (operation 104), clock cycle-boundaries 401 and 402 are placed to correspond to the * operation's internal pipeline stages. As defined by the tuple, the * operation has a pipeline depth of 2. In determining if the * operation and the + operation may be chained, the $\Delta_{in}$ for the + operation (operation 105) is added to the $\Delta_{out}$ for the * operation. From the tuples, 1.2 ns is added to 0.6 ns resulting in a value of 1.8 ns. 1.8 ns is less than T (which is 2.0 ns) so no clock cycle-boundary is required on this edge. Next, the * operation is also attempted to be added to the chain, but the maximum delay equals $\Delta_{out*}+\Delta_{in,+}+\Delta_{in,*}$=0.6+1.2+1.6=3.4 ns, which exceeds T. Therefore, a clock cycle-boundary 403 is placed on edge 107. For recurrence cycle C1, both the following conditions have been satisfied: the number of clock cycle-boundaries placed around C1 (=3) equals II×Distance(C1) (=3*(0+1)=3); the maximum delay between successive clock cycle-boundaries is <=T. Hence, step 303 determines that a placement exists for recurrence cycle C1. Similarly, these conditions are satisfied for recurrence cycle C2 by placing a clock cycle-boundary 404 on edge 108. Therefore, in step 304 a determination is made that the loop iteration schedule is valid.

The embodiment of the invention of FIG. 3 may also be used to determine a comparative cost of the iteration schedule proposed by the input candidate scheduling vector (step 205), input initiation interval (step 203) and input clock cycle-time (step 204). Here, if step 302 produces a placement of clock cycle-boundaries on the edges of each recurrence cycle C, these placements can be combined to form a placement of clock cycle-boundaries on the edges of the dependence graph. This resulting placement may be used to estimate the cost of the resulting hardware associated with the proposed iteration schedule.

Figure 5:
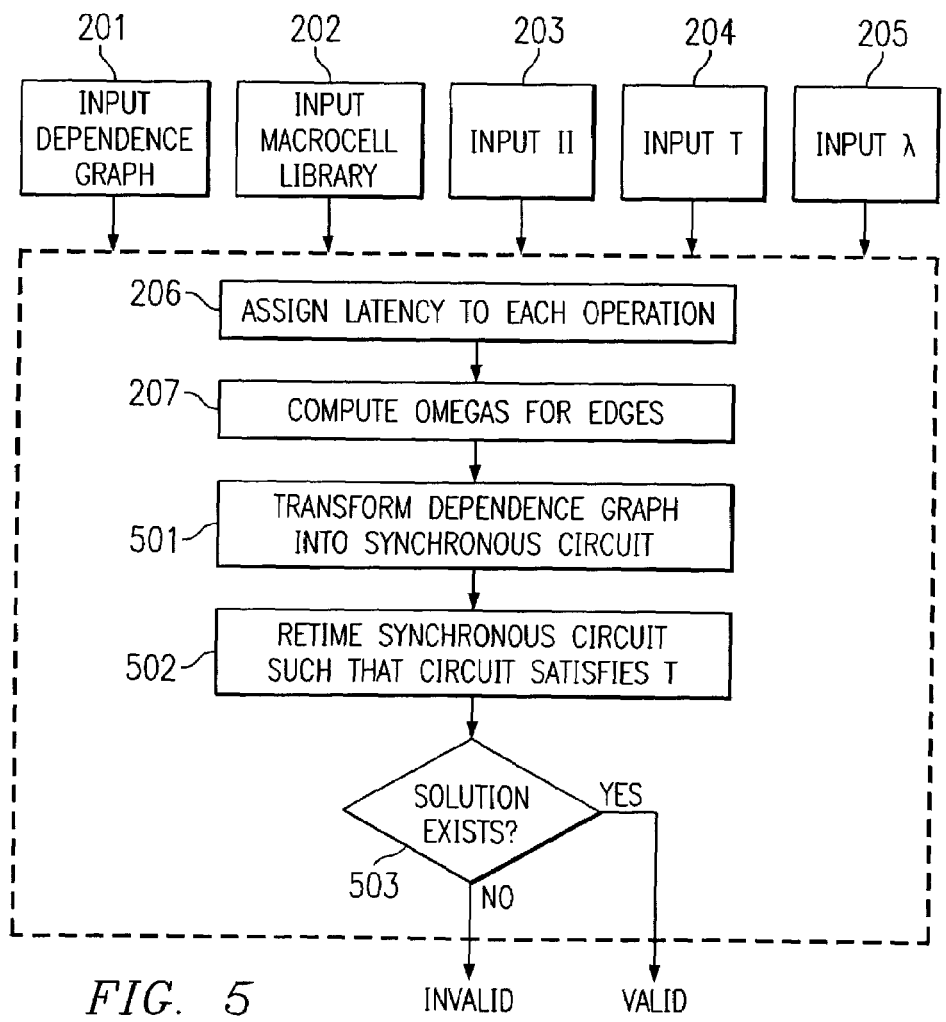
FIG. 5 depicts a flow diagram of a method to determine the validity of the loop iteration schedule resulting from $\lambda$, II and T using retiming.

FIG. 5 depicts a flow diagram of a method to determine the validity of the loop iteration schedule resulting from $\lambda$, II and T using retiming. FIG. 5 shows another embodiment of the invention described in FIG. 2. Here, retiming is used to determine the validity of the loop iteration schedule resulting from $\lambda$, II, and T. Steps 201–207 of FIG. 5 are identical to steps 201–207 of FIG. 2. In step 501 the dependence graph is transformed into a synchronous circuit, where operations are represented as sets of combinational nodes, wires, and registers, and edges are represented as wires and registers. This transformation is performed as follows. For an operation whose assigned latency tuple is $\Delta_{thru,op}$ (i.e., has a pipeline depth of 0), the operation is modeled as a combinational node in the synchronous circuit graph with delay $=\Delta_{thru,op}$. An operation with assigned latency of the form $<\Delta_{in,op}, 1\ \Delta_{out,op}>$ is modeled as a set of 3 combinational nodes in the synchronous circuit graph connected in series by wires. The first combinational node is assigned delay=$\Delta_{in,op}$. The second combinational node is assigned delay=T. The third combinational node is assigned delay=$\Delta_{out,op}$. Additionally, a register in placed between the first node and the second node. An operation with assigned latency of the form $<\Delta_{in,op}, pd, \Delta_{out,op}>$ where the pipeline depth pd is greater than 1 is modeled as a set of pd+1 combinational nodes in the synchronous circuit graph connected in series by wires. The first combinational node is assigned delay=$\Delta_{in,op}$. The last combinational node is assigned delay=$\Delta_{out,op}$. All other pd-1 intermediate combinational nodes are assigned delay=T. Furthermore, each edge in the dependence graph becomes a wire in the synchronous circuit containing w(e) registers, where w(e)=II×$\lambda \cdot d_e$. Using this methodology, the dependence graph has been transformed into a synchronous circuit consisting of nodes representing combinational circuit elements with associated delay connected with wires containing 0 or more registers.

In step 502, the synchronous circuit is retimed such that the resulting circuit satisfies the specified T. Retiming is a previously known technique, see, Sections 4–6 of C. E. Leiserson and J. B. Saxe, "RETIMING SYNCHRONOUS CIRCUITRY," Algorithmica, 6(1):5–35, 1991 which is hereby incorporated by reference in its entirety for all purposes. In this technique, registers are added at some points in a circuit and removed from others in such a way that the functional behavior of the circuit as a whole is preserved, with the objective of meeting a given clock period for the given circuit.

In step 503 a determination is made as to whether a solution to the retiming exists or not. If a solution exists, the loop iteration schedule is valid, otherwise it is invalid.

Figure 6A:
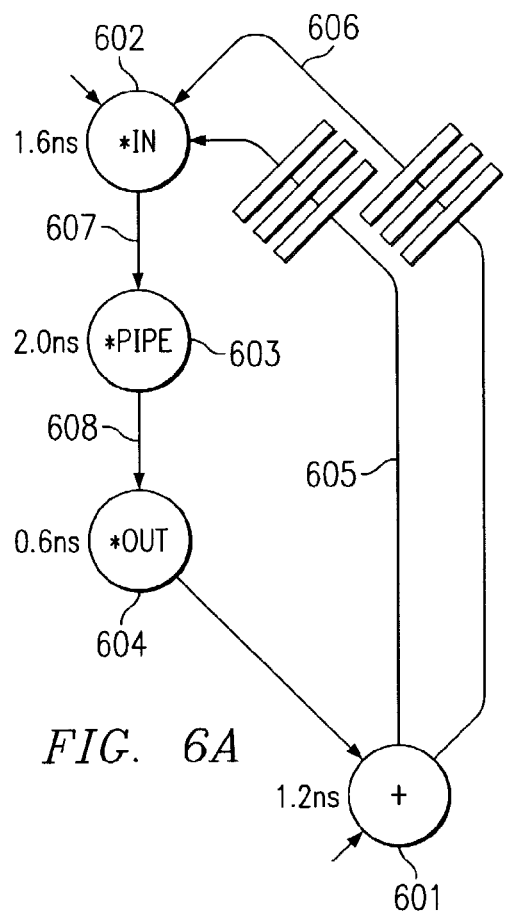
FIG. 6A is a synchronous circuit derived from applying the flow diagram of FIG. 5 on the dependence graph of FIG. 1B.

FIG. 6A is a synchronous circuit derived from applying the flow diagram of FIG. 5 on the dependence graph of FIG. 1B. FIG. 6 shows an example to illustrate the method of FIG. 5. For this example, in step 201 of FIG. 5, the input dependence graph received is the dependence graph shown in FIG. 1B. The macrocell library of step 202 (FIG. 5) contains tuples <1.6 ns, 2, 0.6 ns> and <0.3 ns, 3, 0.2 ns> for multiplication (*) operations and tuples <1.2 ns> and <0.1 ns, 1, 0.1 ns> for addition (+) operations. The II is 3 (step 203 of FIG. 5), $\lambda=[100\ 1]^T$ (step 205 of FIG. 5), and T=2.0 ns (step 204 of FIG. 5). In step 206, a latency associated with a fastest macrocell from the macrocell library is assigned to each operation so the <1.6 ns, 2, 0.6 ns> tuple is assigned to the * operation and the <1.2 ns> tuple is assigned to the + operation. The tuple for * was selected because pd=3 in <0.3 ns, 3, 0.2 ns> indicates a slower * operation than the pd=2 of the <1.6 ns, 2, 0.6 ns>. Similarly, pd=0 in tuple <1.2 ns> is less than pd=1 in tuple <0.1 ns, 0.1, 0.1 ns> for the + operation (operation 105). In step 207, the omegas are computed for each edge. The omega of an edge annotated with iteration distance vector d is the dot product $\lambda^T \cdot d$. Using this relationship, the omega of edge 107 is $[100\ 1] \cdot [0\ 1]^T=1$. Similarly, the omega of edge 108 is $[100\ 1] \cdot [1-99]^T=1$. The omegas of all other edges are 0 because their distance vectors d equal $[0\ 0]^T$. In step 501 the add operation (operation 105) is modeled as a combinational node 601 in FIG. 6A with a delay of 1.2 ns. Additionally, the multiply operation (operation 104 of FIG. 1B) is modeled as three nodes, node 602 corresponds to the input stage of the multiplier and has a latency of 1.6 ns. Node 603 corresponds to the single internal pipeline stage of the multiplier and is assigned a latency of T=2.0 ns. Node 604 corresponds to the output stage of multiplier and has a latency of 0.6 ns. Next the number of registers on each edge 605 and 606 is determined by w(605)=II×$\lambda \cdot d_{605}$ and w(606)=II×$\lambda \cdot d_{606}$. For example edge (706)=3*$[100\ 1]^T \cdot [1\ -99]$=3 registers. FIG. 6A shows the transformed synchronous circuit.

Figure 6B:
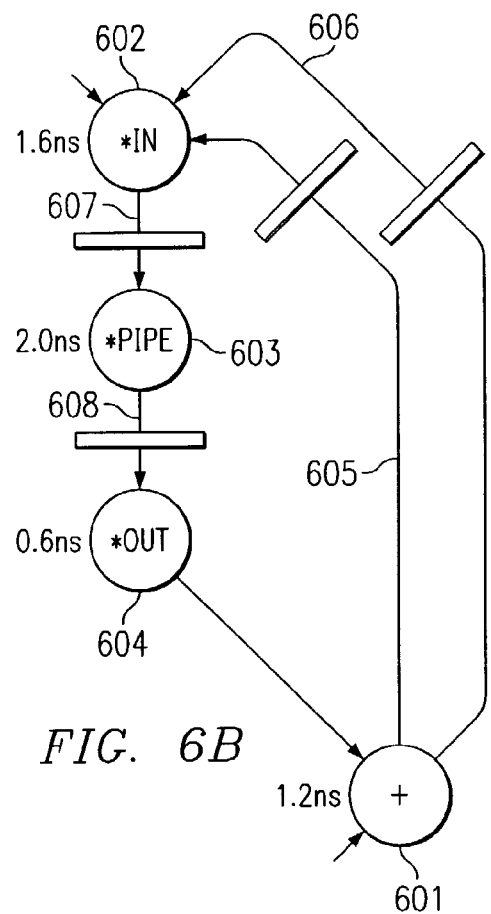
FIG. 6B is a retimed synchronous circuit corresponding to FIG. 6A.

FIG. 6B is a retimed synchronous circuit corresponding to FIG. 6A. In step 502, the synchronous circuit of FIG. 6A is retimed such that the resulting circuit satisfies T. FIG. 6B illustrates the circuit after successful retiming. In the retiming problem each pipelining edge 607 and 608 must include a register. These registers correspond to the internal pipelining stages or the internal latching-stages of the multiplication operation. Retiming will, using these criteria, move the registers around resulting in the circuit diagram of FIG. 6B. As shown by FIG. 6B one of the three registers from each of the back edges 605 and 606 has moved through the 602 vertex and a second register of the three registers from each of the back edges 605 and 606 has moved through the 602 and the 603 vertices which ensures that the timing constraints have been met. As shown by FIG. 6B, every edge now has 0 or more registers (in other words no edge contains a negative register). Additionally, the register to register path delay in FIG. 6B will have a delay of less than or equal to the specified clock period. Therefore, a solution to the retiming problem has been found, and step 503 returns 'valid'.

The embodiment of FIG. 5 may also be used to determine a comparative cost of the iteration schedule proposed by the input candidate scheduling vector (step 205), input initiation interval (step 203) and input clock cycle-time (step 204). Here, if step 502 is able to successfully retime the synchronous circuit of step 501, a placement of clock cycle-boundaries on the edges of the input dependence graph can be derived directly from the resulting retimed circuit. In one embodiment, the number of clock cycle-boundaries on an edge in the input dependence graph equals the number of registers on the corresponding wire in the retimed circuit. This placement may be used to estimate the cost of the resulting hardware associated with the proposed iteration schedule. In a different embodiment of step 502, the synchronous circuit is retimed such that it satisfies T and has a minimal number of register bits. This formulation of retiming is also previously known, see, Section 8 of C. E. Leiserson and J. B. Saxe, "RETIMING SYNCHRONOUS CIRCUITRY," Algorithmica, 6(1):5–35, 1991. In this technique, registers are added at some points in a circuit and removed from others in such a way that the functional behavior of the circuit as a whole is preserved, with the objective of meeting a given clock period for the given circuit, and also to minimize the total number of register bits.

What is claimed is:

1. A method for determining validity of a proposed loop iteration schedule comprising:
   receiving a dependence graph including operations and edges between said operations, the dependence graph having at least one recurrence cycle;
   receiving a performance specification;
   receiving at least one latency for each operation of the dependence graph, the latency comprising a real time;
   determining existence of a placement of clock cycle-boundaries in said dependence graph such that all dependence and timing constraints are satisfied for said performance specification wherein said performance specification includes a proposed initiation interval, and a proposed clock cycle-time;
   reporting said existence as validity of said proposed loop iteration schedule;
   receiving a proposed loop iteration scheduling vector; and
   calculating omegas for edges included in said dependence graph.

2. The method of claim 1, wherein the latencies are included in a macrocell library and each operation of the dependence graph is assigned a latency from the macrocell library.

3. The method of claim 1 wherein for every recurrence cycle in said dependence graph, the total number of clock cycle-boundaries equals the proposed initiation interval multiplied by a sum of the omegas for the edges belonging to said recurrence cycle.

4. The method of claim 1 wherein a maximum delay between successive clock cycle-boundaries is no greater than the proposed clock cycle-time.

5. The method of claim 1 wherein the existence of a placement of clock cycle-boundaries in said dependence graph is done such that:
   for every recurrence cycle in said dependence graph, the total number of clock cycle-boundaries so placed equals the proposed initiation interval multiplied by the sum of the omegas for the edges for the edges belonging to said recurrence cycle, and
   a maximum delay between successive clock cycle-boundaries so placed is no greater than the proposed clock cycle-time.

6. The method of claim 5 further including:
   determining said placement.

7. The method of claim 6 further including:
   determining a comparative cost of said proposed loop iteration schedule as a function of said placement.

8. The method of claim 7 wherein said comparative cost equals the number of cycle-boundary bits in said placement.

9. The method of claim 5 wherein said existence is determined by:
   transforming said dependence graph into a synchronous circuit;
   retiming said synchronous circuit such that it satisfies the proposed clock cycle-time; and
   deriving said existence to be existence of a solution to said retiming problem.

10. The method of claim 9 further including determining a comparative cost of said proposed loop iteration schedule as a function of the solution to said retiming problem, if one exists.

11. The method of claim 6 wherein said placement of clock cycle-boundaries in said dependence graph is determined by:
    transforming said dependence graph into a synchronous circuit;
    retiming said synchronous circuit such that it satisfies the proposed clock cycle-time and has a minimal number of register bits; and
    deriving said placement from the solution to said retiming problem, if a solution exists.

12. The method of claim 1 wherein said existence is determined by:
    enumerating all recurrence cycles in said dependence graph;
    for each such recurrence cycle, determining a placement of clock cycle-boundaries along said recurrence cycle such that:
       a total number of clock cycle-boundaries so placed equals the proposed initiation interval multiplied by the sum of the omegas for the edges belonging to said recurrence cycle;
       a maximum delay between successive clock cycle-boundaries so placed is no greater than the proposed clock cycle-time; and
    deriving said existence to be existence of a placement of clock cycle-boundaries along each recurrence cycle.

13. The method of claim 12 wherein said placement of clock cycle-boundaries along said each recurrence cycle further includes a condition that the clock cycle-boundaries so placed are consistent with previous clock cycle-boundary placements.

14. The method of claim 13 further including combining said placement of clock cycle-boundaries along each said recurrence cycle into said placement of clock cycle-boundaries in said dependence graph.

15. The method of claim 14 further including determining a comparative cost of said proposed loop iteration schedule as a function of said placement of clock cycle-boundaries in said dependence graph.

16. The method of claim 1 wherein a plurality of the latencies are expressed as tuples, each tuple comprising a real time delay between when a signal arrives and is latched, a pipeline depth, and a real time delay between when the signal leaves a last latch and is output.

17. The method of claim 16 wherein at least one of the latencies has a pipeline depth of zero and is expressed as a real time delay between an input and an output.

18. The method of claim 16 wherein a tuple corresponding to a fastest latency is selected for an operation.

19. The method of claim 16 wherein tuples corresponding to an operation are only partially ordered.

20. The method of claim 16 wherein a number of clock cycle-boundaries placed on an operation is equal to its pipeline depth.

21. The method of claim 16 wherein a clock cycle-boundary is placed on an edge when a delay between a most-recently placed cycle-cycle boundary in a recurrence cycle and an operation that the edge feeds exceeds a proposed clock cycle-time.

22. The method of claim 1 wherein for every recurrence cycle in the dependence graph, the total number of clock cycle-boundaries equals a proposed initiation interval multiplied by a sum of omegas for edges belonging to the recurrence cycle.

23. The method of claim 1 wherein the recurrence cycles are enumerated and the placement of clock cycle-boundaries along each said recurrence cycle further includes a condition that the clock cycle-boundaries so placed are consistent with previous clock cycle-boundary placements.

24. The method of claim 1 wherein the existence is determined by transforming the dependence graph into a synchronous circuit and retiming the synchronous circuit such that it satisfies a proposed clock cycle-time.

25. The method of claim 24 wherein an operation of the dependence graph is assigned a latency expressed as a tuple comprising a real time delay between when a signal arrives and is latched, a pipeline depth, and a real time delay between when the signal leaves a last latch and is output and wherein the operation is modeled in the synchronous circuit as set of combinational nodes connected by wires, including one combinational node representing the real time delay between when a signal arrives and is latched, one combinational node representing the real time delay between when the signal leaves a last latch and is output and a number of additional combination nodes equal to the pipeline depth.

26. An apparatus for determining validity of a proposed loop iteration schedule comprising:
   means for assigning latencies to dependence graph operations;
   means for calculating omegas for each edge associated with said dependence graph;
   means for determining existence of a placement of clock cycle-boundaries in said dependence graph wherein for every recurrence cycle in said dependence graph, a total number of clock cycle-boundaries so placed equals a proposed initiation interval multiplied by a sum of the omegas for the edges belonging to the recurrence cycle of said dependence graph and a maximum delay between successive clock cycle-boundaries so placed is no greater than a proposed clock cycle-time; and
   means for determining validity of proposed iteration schedule vectors.

27. The apparatus of claim 26 further including:
   means for determining said placement of said clock cycle boundaries.

28. The apparatus of claim 27 further including means for determining a comparative cost of said proposed loop iteration schedule as a function of said place of clock cycle boundaries in said dependence graph.

29. The apparatus of claim 26 wherein said recurrence cycles are enumerated and said placement of clock cycle-boundaries along each said recurrence cycle further includes a condition that the clock cycle-boundaries so placed are consistent with previous clock cycle-boundary placements.

30. The apparatus of claim 26 wherein said means for determining existence includes means for:
   transforming said dependence graph into a synchronous circuit;
   retiming said synchronous circuit such that it satisfies the proposed clock cycle-time and has a minimal number of register bits; and
   deriving said placement from the solution to said retiming problem, if a solution exists.

31. A computer product program comprising
   a memory having computer readable code embodied thereon for implementing a method comprising steps of:
   assigning latencies to dependence graph operations;
   calculating omegas for each edge associated with said dependence graph operations;
   determining existence of a placement of clock cycle-boundaries in said dependence graph, wherein for every recurrence cycle in said dependence graph, a total number of clock cycle-boundaries so placed equals a proposed initiation interval multiplied by a sum of the omegas for the edges belonging to the recurrence cycle of said dependence graph, and a maximum delay between successive clock cycle-boundaries so placed is no greater than a proposed clock cycle-time; and
   determining validity of proposed iteration schedule vectors.

32. The computer product program of claim 31 wherein said method further comprises:
   determining said placement of said clock cycle boundaries.

33. The computer product program of claim 32 wherein said method further comprises determining a comparative cost of said proposed loop iteration schedule as a function of said placement of clock cycle-boundaries in said dependence graph.

34. The computer product program of claim 31 wherein said recurrence cycles are enumerated and said placement of clock cycle-boundaries along each said recurrence cycle further includes a condition that the clock cycle-boundaries so placed are consistent with previous clock cycle-boundary placements.

35. The computer product program of claim 31 wherein said determining existence includes:
   transforming said dependence graph into a synchronous circuit;
   retiming said synchronous circuit such that it satisfies the proposed clock cycle-time and has a minimal number of register bits; and
   deriving said placement from the solution to said retiming problem, if a solution exists.

36. A computer product program comprising a memory having computer readable code embodied thereon for implementing a method comprising steps of:
   receiving a dependence graph including operations and edges between the operations, the dependence graph having at least one recurrence cycle wherein for every recurrence cycle in the dependence graph, a total number of clock cycle-boundaries equals a proposed initiation interval multiplied by a sum of omegas for edges belonging to the recurrence cycle;
   receiving a performance specification;
   receiving at least one latency for each operation of the dependence graph, the latency comprising a real time delay; and
   determining existence of a placement of clock cycle-boundaries in the dependence graph such that all dependence and timing constraints are satisfied for the performance specification.

37. A computer product program comprising a memory having computer readable code embodied thereon for implementing a method comprising steps of:
   receiving a dependence graph including operations and edges between the operations, the dependence graph having at least one recurrence cycle wherein recurrence cycles are enumerated and placement of clock cycle-boundaries along each said recurrence cycle further includes a condition that the clock cycle-boundaries so placed are consistent with previous clock cycle-boundary placements;

receiving a performance specification;

receiving at least one latency for each operation of the dependence graph, the latency comprising a real time delay; and determining existence of a placement of clock cycle-boundaries in the dependence graph such that all dependence and timing constraints are satisfied for the performance specification.

38. The computer program product of claim 36 wherein the existence is determined by transforming the dependence graph into a synchronous circuit and retiming the synchronous circuit such that it satisfies a proposed clock cycle-time.

39. A method comprising steps of:

assigning latencies to dependence graph operations;

calculating omegas for each edge associated with said dependence graph operations;

determining existence of a placement of clock cycle-boundaries in said dependence graph, wherein for every recurrence cycle in said dependence graph, a total number of clock cycle-boundaries so placed equals a proposed initiation interval multiplied by a sum of the omegas for the edges belonging to the recurrence cycle or said dependence graph, and a maximum delay between successive clock cycle-boundaries so placed is no greater than a proposed clock cycle-time; and determining validity of proposed iteration schedule vectors.

* * * * *